United States Patent
Kim et al.

(10) Patent No.: US 8,477,557 B2
(45) Date of Patent: Jul. 2, 2013

(54) INPUT CIRCUIT OF SEMICONDUCTOR MEMORY APPARATUS AND CONTROLLING METHOD THEREOF

(75) Inventors: Young Ju Kim, Ichon (KR); Su Jeong Sim, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/249,691

(22) Filed: Sep. 30, 2011

(65) Prior Publication Data

US 2012/0033523 A1    Feb. 9, 2012

Related U.S. Application Data

(62) Division of application No. 12/333,143, filed on Dec. 11, 2008, now Pat. No. 8,031,533.

(30) Foreign Application Priority Data

Feb. 14, 2008 (KR) .................. 10-2008-0013451
Aug. 8, 2008 (KR) .................. 10-2008-0077709

(51) Int. Cl.
*G11C 8/00* (2006.01)

(52) U.S. Cl.
USPC ............ 365/230.08; 365/230.05; 365/230.06

(58) Field of Classification Search
USPC ..................... 365/230.08, 230.05, 230.06
See application file for complete search history.

(56) References Cited

U.S. PATENT DOCUMENTS

| | | | |
|---|---|---|---|
| 5,903,508 A * | 5/1999 | Choi | ............... 365/229 |
| 6,064,226 A | 5/2000 | Earl | |
| 6,088,743 A | 7/2000 | Takeda | |
| 6,643,218 B1 | 11/2003 | Chun | |
| 7,280,386 B2 | 10/2007 | Klein | |
| 7,394,711 B2 * | 7/2008 | Oh et al. | ............... 365/222 |
| 2007/0064504 A1 | 3/2007 | Jeon | |

FOREIGN PATENT DOCUMENTS

| | | |
|---|---|---|
| JP | 61134982 A | 6/1986 |
| JP | 03228351 A | 10/1991 |
| JP | 04-222989 | 8/1992 |
| JP | 05304212 | 11/1993 |
| JP | 2000195298 A | 7/2000 |
| JP | 2006215854 A | 8/2006 |
| JP | 2006245063 A | 9/2006 |
| JP | 2007068176 | 3/2007 |
| JP | 2008148253 | 6/2008 |
| KR | 1020060117488 | 11/2006 |
| KR | 1020080053547 A | 6/2008 |

* cited by examiner

*Primary Examiner* — Son Dinh
*Assistant Examiner* — Nam Nguyen
(74) *Attorney, Agent, or Firm* — Baker & McKenzie LLP

(57) ABSTRACT

Disclosed is an input circuit of a semiconductor memory apparatus. The input circuit includes a first buffer and a second buffer. The first buffer has an input terminal connected with a first input pin for receiving a control signal used in a multi-control mode for controlling an entire memory area by dividing the entire memory area, and an output terminal having a first level according to a control mode signal. The second buffer has an input terminal connected with a second input pin for receiving one of plural signals used in a single control mode for controlling the entire memory area without dividing the entire memory area, and an output terminal having a second level according to the control mode signal.

17 Claims, 7 Drawing Sheets

FIG.2

|   | 1 | 2 | 3 | 4 | 5 6 7 8 | 9 | 10 | 11 | 12 |
|---|---|---|---|---|---|---|---|---|---|
| A | VDDQ | VDD | VSS | ZQ |  | MF | VSS | VDD | VDDQ |
| B | VSSQ | DQ0 | DQ1 | VSSQ |  | VSSQ | DQ9 | DQ8 | VSSQ |
| C | VDDQ | DQ2 | DQ3 | VDDQ |  | VDDQ | DQ11 | DQ10 | VDDQ |
| D | VSSQ | WDQS0 | RDQS0 | VSSQ |  | VSSQ | RDQS1 | WDQS1 | VSSQ |
| E | VDDQ | DQ4 | DM0 | VDDQ |  | VDDQ | DM1 | DQ12 | VDDQ |
| F | VDD | DQ6 | DQ5 | CAS# |  | CS# | DQ13 | DQ14 | VDD |
| G | VSS | VSSQ | DQ7 | BA0 |  | BA1 | DQ15 | VSSQ | VSS |
| H | VREF | A1 | RAS# | CKE |  | WE# | RFM | A5 | VREF |
| J | VSS | A12 | CS1 | VDDQ |  | VDDQ | CK# | CK | VSS |
| K | VDD | A10 | A2 | A0 |  | A4 | A6 | A8/AP | VDD |
| L | VSS | VSSQ | DQ25 | A11 |  | A7 | DQ17 | VSSQ | VSS |
| M | VDD | DQ24 | DQ27 | A3 |  | A9 | DQ19 | DQ16 | VDD |
| N | VDDQ | DQ26 | DM3 | VDDQ |  | VDDQ | DM2 | DQ18 | VDDQ |
| P | VSSQ | WDQS3 | RDQS3 | VSSQ |  | VSSQ | RDQS2 | WDQS2 | VSSQ |
| R | VDDQ | DQ28 | DQ29 | VDDQ |  | VDDQ | DQ21 | DQ20 | VDDQ |
| T | VSSQ | DQ30 | DQ31 | VSSQ |  | VSSQ | DQ23 | DQ22 | VSSQ |
| U | VDDQ | VDD | VSS | SEN |  | RES | VSS | VDD | VDDQ |

FIG.6

| | 1 | 2 | 3 | 4 | 5 6 7 8 | 9 | 10 | 11 | 12 |
|---|---|---|---|---|---|---|---|---|---|
| A | VDDQ | VDD | VSS | ZQ | | MF | VSS | VDD | VDDQ |
| B | VSSQ | DQ0 | DQ1 | VSSQ | | VSSQ | DQ9 | DQ8 | VSSQ |
| C | VDDQ | DQ2 | DQ3 | VDDQ | | VDDQ | DQ11 | DQ10 | VDDQ |
| D | VSSQ | WDQS0 | RDQS0 | VSSQ | | VSSQ | RDQS1 | WDQS1 | VSSQ |
| E | VDDQ | DQ4 | DM0 | VDDQ | | VDDQ | DM1 | DQ12 | VDDQ |
| F | VDD | DQ6 | DQ5 | CAS# | | CS# | DQ13 | DQ14 | VDD |
| G | VSS | VSSQ | DQ7 | BA0 | | BA1 | DQ15 | VSSQ | VSS |
| H | VREF | A1 | RAS# | CKE | | WE# | RFM | A5 | VREF |
| J | VSS | N·A | CS1/A12 | VDDQ | | VDDQ | CK# | CK | VSS |
| K | VDD | A10 | A2 | A0 | | A4 | A6 | A8/AP | VDD |
| L | VSS | VSSQ | DQ25 | A11 | N·A (non-allocation) | A7 | DQ17 | VSSQ | VSS |
| M | VDD | DQ24 | DQ27 | A3 | | A9 | DQ19 | DQ16 | VDD |
| N | VDDQ | DQ26 | DM3 | VDDQ | | VDDQ | DM2 | DQ18 | VDDQ |
| P | VSSQ | WDQS3 | RDQS3 | VSSQ | | VSSQ | RDQS2 | WDQS2 | VSSQ |
| R | VDDQ | DQ28 | DQ29 | VDDQ | | VDDQ | DQ21 | DQ20 | VDDQ |
| T | VSSQ | DQ30 | DQ31 | VSSQ | | VSSQ | DQ23 | DQ22 | VSSQ |
| U | VDDQ | VDD | VSS | SEN | | RES | VSS | VDD | VDDQ |

INPUT CIRCUIT OF SEMICONDUCTOR MEMORY APPARATUS AND CONTROLLING METHOD THEREOF

CROSS-REFERENCES TO RELATED APPLICATION

The present application is a divisional application of U.S. patent application Ser. No. 12/333,143 filed Dec. 11, 2008 entitled "Input Circuit of Semiconductor Memory Apparatus and Controlling Method thereof" which claims priority to Korean application number 10-2008-0013451, filed on Feb. 14, 2008 and 10-2008-0077709, filed on Aug. 8, 2008, which are incorporated by reference in their entirety.

BACKGROUND OF THE INVENTION

The present invention relates to a semiconductor memory apparatus. More particularly, the present invention relates to an input circuit of a semiconductor memory apparatus, and a control method thereof.

A conventional semiconductor memory apparatus, for example, a 512M memory, is controlled using a chip selection signal and an address signal.

Meanwhile, additional control signals are necessary to control a 1 G memory as compared with the 512M memory.

The chip selection signal and the address can be used as the additional control signals by increasing the number of the chip selection signal and the address signal.

In the case of a control scheme of increasing the number of the chip selection signals, since the 1 G memory can be used as two 512M memories, a memory control speed can be increased. In the case of a control scheme of increasing the number of the address signals, integration capacity can be increased as compared with the control scheme of increasing the number of the chip selection signals.

An input circuit of a semiconductor memory apparatus according to the prior art includes pins for receiving the increased chip selection signal and address signal, or pins for receiving only one of the increased chip selection signal and address signal according to the control scheme.

The input circuit for receiving the increased chip selection signal or address signal processes only one signal according to the control scheme regardless of the configuration of the pins.

Thus, various configurations of the pins, which receive the increased chip selection signal and the increased address signal, and a control scheme, which can reduce limitation factors of a semiconductor memory apparatus, are required.

SUMMARY OF THE INVENTION

Embodiments of the present invention are directed to providing an input circuit of a semiconductor memory apparatus capable of preventing an abnormal operation due to an unused pin and freely varying a control scheme after the semiconductor memory apparatus is manufactured, and a control method thereof.

In one embodiment, an input circuit of a semiconductor memory apparatus includes a first input pin, a first buffer having an input terminal connected with the first input pin, and an output terminal maintaining a first level according to a control mode signal for determining a control scheme of the semiconductor memory apparatus, a second input pin, and a second buffer having an input terminal connected with the second input pin, and an output terminal maintaining a second level according to the control mode signal.

In another embodiment, an input circuit of a semiconductor memory apparatus includes a plurality of pins for receiving various signals including a control signal used in a multi-control mode for controlling a memory chip by dividing an entire memory area of the memory chip, and an address signal which is not used in the multi-control mode, and a plurality of buffers having input terminals connected with the pins, wherein first and second buffers of the buffers, which are connected with first and second pins for receiving the control signal and the address signal, selectively operate according to a control mode signal for selecting the multi-control mode.

In further another embodiment, an input circuit of a semiconductor memory apparatus includes a first input pin, a second input pin, and a signal path controller for transferring a signal, which is input through the first input pin, to a first or second signal path in response to a control mode signal that determines a control scheme of the semiconductor memory apparatus.

In still another embodiment, an input circuit of a semiconductor memory apparatus includes a first input pin, a first signal path for transferring a first signal, a second signal path for transferring a second signal, and a signal path controller for transferring a signal input through the first input pin to the first or second signal path by determining if the signal input through the first input pin is the first or second signal.

In yet another embodiment, a method is provided to control an input circuit of a semiconductor memory apparatus includes a first buffer for receiving a control signal used in a multi-control mode, which controls an entire memory area by dividing the entire memory area, and a second buffer for receiving an address signal which is not used in the multi-control control mode, the method including determining activation of a control mode signal, and selectively operating the first and second buffers according to the activation of the control mode signal.

According to yet another aspect of the present invention, a method is provided to control an input circuit of a semiconductor memory apparatus including a first buffer for receiving a control signal used in a multi-control mode, which controls an entire memory area by dividing the entire memory area, and a second buffer for receiving an address signal which is not used in the multi-control control mode, the method including determining activation of a control mode signal, and allowing levels of output terminals of the first and second buffers to be fixed to predetermined levels according to the activation of the control mode signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 2 is a view illustrating a FBGA of a semiconductor memory apparatus according to the present invention;

FIG. 6 is a view illustrating a FBGA of the semiconductor memory apparatus in FIG. 5;

DETAILED DESCRIPTION OF THE PREFERRED EMBODIMENTS

Hereinafter, the present invention will be described in detail through embodiments. The embodiments are just for exemplifying the present invention, and the scope of right to be protected of the present invention is not limited by them.

Figure 1:
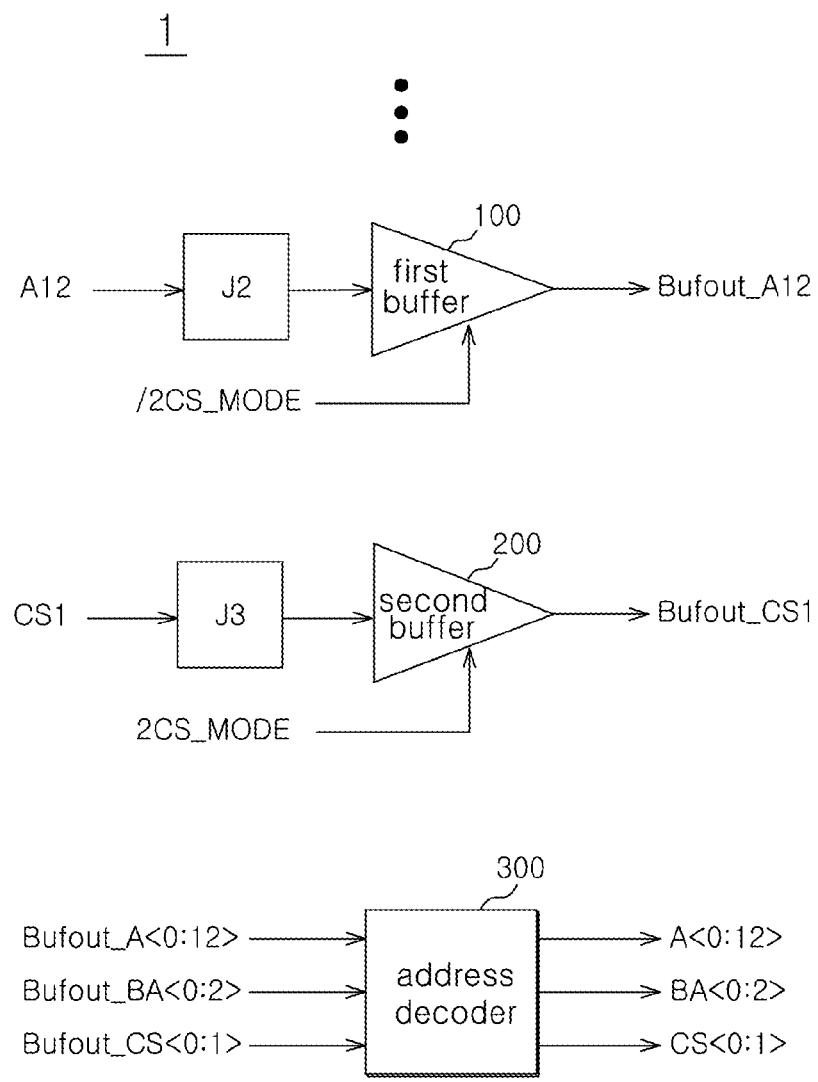
FIG. 1 is a block diagram illustrating an input circuit of a semiconductor memory apparatus according to the present invention.

Since the input circuit of the semiconductor memory apparatus according to the present invention as illustrated in FIG. 1 shows a 1 G memory as an example, an address signal A12 or a chip selection signal CS1 is additionally necessary in addition to an address signal A<0:11> and a chip selection signal CS0 used for controlling a 512M memory.

As illustrated in FIG. 1, the input circuit of the semiconductor memory apparatus according to the present invention includes a first buffer 100, which has an input terminal connected with an additional address input pin J2, a second buffer 200, which has an input terminal connected with an additional chip selection signal input pin J3, and an address decoder 300. Although not shown in FIG. 1, the input circuit includes a plurality of pins for receiving the address signal A<0:11>, a bank address signal BA<0:2> and the chip selection signal CS0, and a plurality of buffers having input terminals connected with the pins.

The additional address signal A12 can be input through the additional address input pin J2 and the additional chip selection signal CS1 can be input through the additional chip selection signal input pin J3.

The pins including the pins J2 and J3 are connected with a FBGA (fine ball grid array), and the number of the pins is determined based on the FBGA as illustrated in FIG. 2 and may various depending on a circuit design.

The first and second buffers 100 and 200 are selectively operated by a control mode signal 2CS_MODE, and remaining buffers are commonly operated by an enable signal instead of the control mode signal 2CS_MODE.

The control mode signal 2CS_MODE is used to determine if the additional chip selection signal CS1 or the additional address signal A12 is used to control the semiconductor memory apparatus.

When the control mode signal 2CS_MODE is activated, a multi-control mode is determined to use the 1 G memory as two chipsets (i.e. two 512M memories) according to the additional chip selection signal CS1. However, if the control mode signal 2CS_MODE is deactivated, a single control mode is determined to use the 1 G memory as one chipset according to the additional address signal A12.

The control mode signal 2CS_MODE can be input from a memory controller out of the semiconductor memory apparatus, or can be generated from the internal configuration of the semiconductor memory apparatus.

The memory controller includes a GPU (Graphic Processing Unit), a CPU (Central Processing Unit) and the like, and the internal configuration of the semiconductor memory apparatus includes an MRS (mode register set), an EMRS (extended mode register set) and the like.

The address decoder 300 receives an address signal Bufout_A<0:12>, a bank address signal Bufout_BA<0:2> and a chip selection signal Bufout_CS<0:1> from plural buffers including the first and second buffers 100 and 200, and decode the signals for output.

Figure 3:
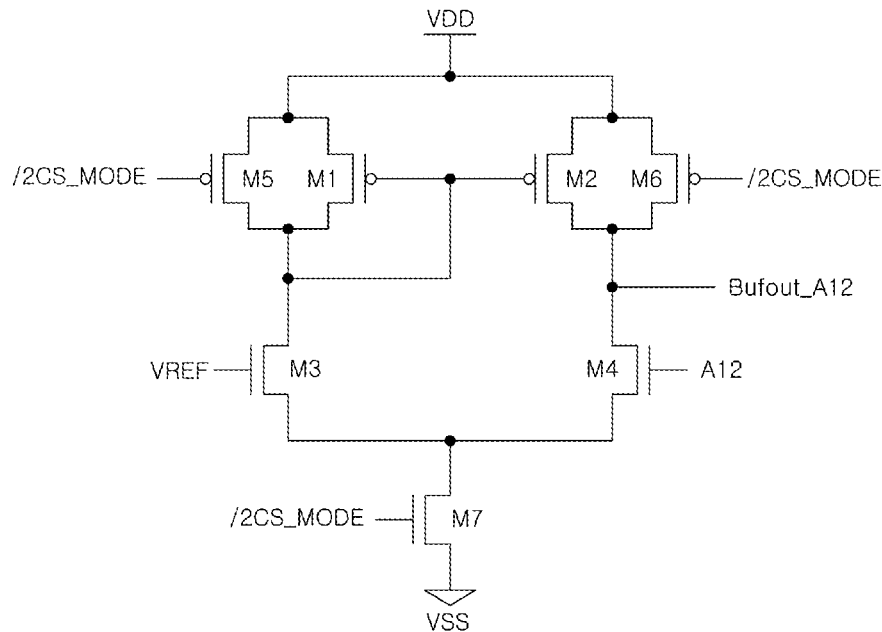
FIG. 3 is a circuit diagram illustrating the first buffer in FIG. 1.

As illustrated in FIG. 3, the first buffer 100 includes first to seventh transistors M1 to M7. The first to fourth transistors M1 to M4 constitute a differential circuit and the fifth to seventh transistors M5 to M7 determine activation of the differential circuit. The third transistor M3 receives reference voltage VREF through a gate thereof and the fourth transistor M4 receives the additional address signal A12 through a gate thereof. The fifth to seventh transistors M5 to M7 commonly receive an inverted control mode signal/2CS_MODE through gates thereof to determine the activation of the differential circuit.

Figure 4:
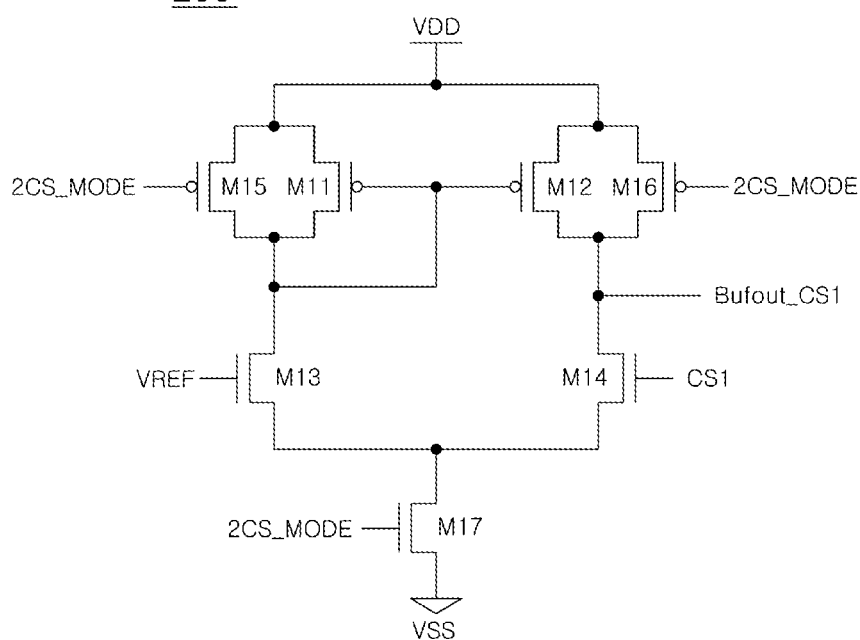
FIG. 4 is a circuit diagram illustrating the second buffer in FIG. 1.

As illustrated in FIG. 4, the second buffer 200 includes first to seventh transistors M11 to M17. The first to fourth transistors M11 to M14 constitute a differential circuit and the fifth to seventh transistors M15 to M17 determine activation of the differential circuit. The third transistor M13 receives reference voltage VREF through a gate thereof and the fourth transistor M14 receives the additional chip selection signal CS1 through a gate thereof. The fifth to seventh transistors M15 to M17 commonly receive the control mode signal 2CS_MODE through gates thereof to determine the activation of the differential circuit.

Hereinafter, a method for controlling the input circuit of the semiconductor memory apparatus according to the present invention will be described.

The present invention includes the pins for receiving the additional address signal A12 and the additional chip selection signal CS1 and the FBGA, and can operate the semiconductor memory apparatus in one of the multi-control mode and the single control mode according to the control mode signal 2CS_MODE.

As described above, the control mode signal 2CS_MODE can be input from a memory controller out of the semiconductor memory apparatus or can be generated from the semiconductor memory apparatus.

When the semiconductor memory apparatus is to be operated in the multi-control mode, the control mode signal 2CS_MODE is activated. In the multi-control mode, since the additional chip selection signal CS1 is not used, an unused additional address signal A12 is not input.

If the control mode signal 2CS_MODE is activated to a high level, the inverted control mode signal/2CS_MODE becomes a low level.

Thus, the fifth and sixth transistors M5 and M6 of the first buffer 100 in FIG. 3 are turned on and the seventh transistor M7 thereof is turned off, so that an output signal Bufout_A12 has a high level regardless of an operation of the first to fourth transistors M1 and M4. In detail, the first buffer 100 stops to operate.

Further, the control mode signal 2CS_MODE is at the high level, so that the fifth and sixth transistors M15 and M16 of the second buffer 200 in FIG. 4 are turned off and the seventh transistor M17 thereof is turned on.

Thus, the first and second transistors M11 and M12 operate according to the difference between the gate level of the fourth transistor M14 receiving the additional chip selection signal CS1 and the gate level of the third transistor M13, so that an output signal Bufout_CS1 is output at a high or low level. In detail, the second buffer 200 normally operates.

According to the prior art, although the additional address signal A12 is not input in the multi-control mode, a pin allocated to receive the additional address signal A12 may be in a floating state. However, according to the present invention, if the multi-control mode is determined based on the control mode signal 2CS_MODE, output of the first buffer 100 is fixed to a predetermined level although the additional address signal A12 is not input, so that an operation error of the input circuit can be prevented. Further, according to the present invention, even when the level of the pin for receiving the additional address signal A12 represents abnormal variation due to variation of various operation environments or an operation error of an external system, an output level is fixed according to the control mode signal 2CS_MODE, so that the operation error of the input circuit can be fundamentally prevented.

The address decoder 300 decodes the address signal Bufout_A<0:12>, the bank address signal Bufout_BA<0:2> and the chip selection signal Bufout_CS<0:1> to output the decoded signals, so that a data input/output operation of the semiconductor memory apparatus can be stably performed.

Meanwhile, when the semiconductor memory apparatus is to be operated in the single control mode, the control mode signal 2CS_MODE is deactivated. In the single control mode, since the additional address signal A12 is used, an unused additional chip selection signal CS1 is not input.

If the control mode signal 2CS_MODE is deactivated to a low level, the inverted control mode signal/2CS_MODE becomes a high level, so that the fifth and sixth transistors M5 and M6 of the first buffer 100 in FIG. 3 are turned off and the seventh transistor M7 thereof is turned on.

Thus, the first and second transistors M1 and M2 operate according to the difference between the gate level of the fourth transistor M4 receiving the additional address signal A12 and the gate level of the third transistor M3, so that the output signal Bufout_A12 is output at a high or low level. In detail, the first buffer 100 normally operates.

Further, the control mode signal 2CS_MODE is at the low level, so that the fifth and sixth transistors M15 and M16 of the second buffer 200 in FIG. 4 are turned on and the seventh transistor M17 thereof is turned off. Thus, an output signal Bufout_CS1 has a high level regardless of the operation of the first to fourth transistors M11 and M14. In detail, the second buffer 200 stops to operate.

According to the prior art, although the additional chip selection signal CS1 is not input in the single control mode, a pin allocated to receive the additional chip selection signal CS1 may be in a floating state. However, according to the present invention, if the single control mode is determined based on the control mode signal 2CS_MODE, output of the second buffer 200 is fixed to a predetermined level although the additional chip selection signal CS1 is not input, so that an operation error of the input circuit can be prevented. Further, according to the present invention, even when the level of the pin for receiving the additional chip selection signal CS1 represents abnormal variation due to variation of various operation environments or an operation error of an external system, an output level is fixed according to the control mode signal 2CS_MODE, so that the operation error of the input circuit can be fundamentally prevented. The address decoder 300 decodes the address signal Bufout_A<0:12>, the bank address signal Bufout_BA<0:2> and the chip selection signal Bufout_CS<0:1> to output the decoded signals, so that a data input/output operation of the semiconductor memory apparatus can be stably performed.

As described above, the present invention can not only fundamentally prevent the operation error of the input circuit due to the floating state of the input pin, but can also selectively use the multi-control mode and the single control mode based on the control mode signal 2CS_MODE.

Hereinafter, a semiconductor memory apparatus according to another embodiment of the present invention will be described.

Figure 5:
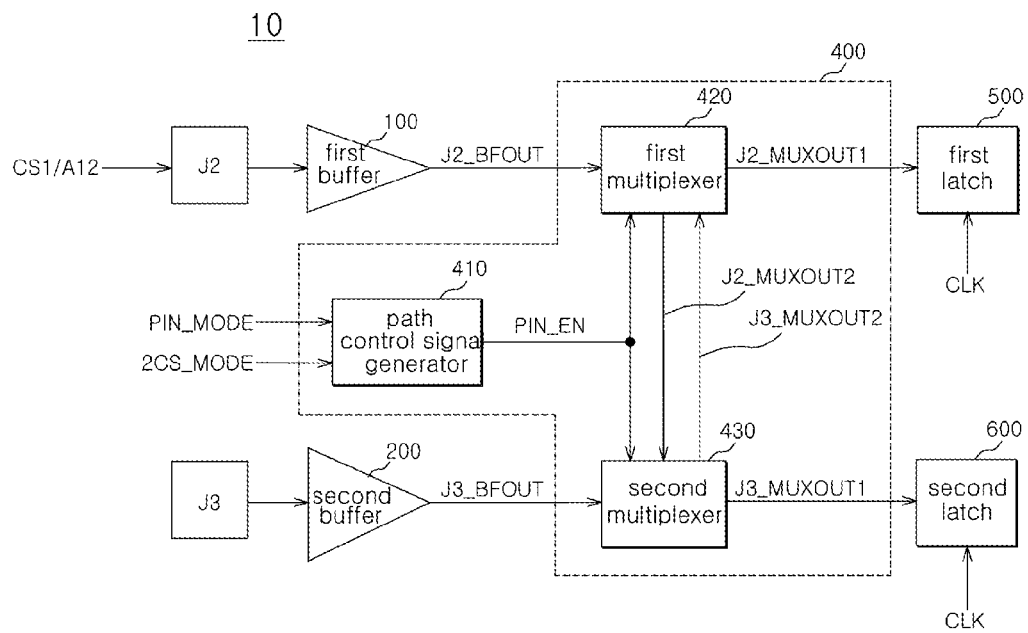
FIG. 5 is a block diagram illustrating an input circuit of a semiconductor memory apparatus according to another embodiment of the present invention.

Referring to FIG. 5, any one of the chip selection signal CS1 and the address signal A12 can be input to the first input pin J2, and the second input pin J3 can be used as an extra pin because no signal is input thereto.

FIG. 5 is a block diagram illustrating an input circuit of the semiconductor memory apparatus according to the present invention.

As illustrated in FIG. 5, the input circuit of the semiconductor memory apparatus according to the present invention includes the first input pin J2, the second input pin J3, a first buffer 100, a second buffer 200, a signal path controller 400, a first latch 500 and a second latch 600.

The signal path controller 400 includes a path control signal generator 410, a first multiplexer 420 and a second multiplexer 430.

A signal path including the first input pin J2, the first buffer 100, the first multiplexer 420 and the first latch 500 is used to transfer a chip selection signal CS1 and will be referred to as a first signal path. A signal path including the second input pin J3, the second buffer 200, the second multiplexer 430 and the second latch 600 is used to transfer an address signal A12 and will be referred to as a second signal path.

The first buffer 100 outputs the signal input through the first input pin J2 by buffering the signal.

The second buffer 200 outputs the signal input through the second input pin J3 by buffering the signal.

The signal path controller 400 transfers an output signal J2_BFOUT of the first buffer 100 and an output signal J3_BFOUT of the second buffer 200 to the first or second latch 500 or 600 according to control mode signals, i.e. first and second mode signals PIN_MODE and 2CS_MODE.

The first mode signal PIN_MODE is used to determine whether the first and second input pins J2 and J3 are independently or selectively used. In a case in which the first and second input pins J2 and J3 are independently used, the first mode signal PIN_MODE is at a low level. In a case in which one of the first and second input pins J2 and J3 are used, for example, when the first input pin J2 is used, the first mode signal PIN_MODE is at a high level.

The second mode signal 2CS_MODE is used to define a multi-control scheme and a single control scheme. In a case in which the chip selection signal CS1 is input for the multi-control scheme, the second mode signal 2CS_MODE is at a high level. In a case in which the address signal A12 is input for the single control scheme, the second mode signal 2CS_MODE is at a low level.

The first latch 500 latches an output signal J2_MUXOUT1 of the first multiplexer 420 according to a clock signal CLK.

The second latch 600 latches an output signal J3_MUXOUT1 of the second multiplexer 430 according to the clock signal CLK.

FIG. 6 is a view illustrating a FBGA of the semiconductor memory apparatus according to the present invention.

As illustrated in FIG. 6, the first input pin J2 is subject to pin allocation such that any one of the chip selection signal CS1 and the address signal A12 can be input into the first input pin J2, and a controller (e.g. graphic processor) controlling the semiconductor memory apparatus can receive pin allocation information from a semiconductor memory manufacturer.

Further, the pin allocation is not basically applied to the second input pin J3. In detail, when the semiconductor memory apparatus is operated using the multi-control scheme, i.e. when the chip selection signal CS1 is input to the first input pin J2 and the address signal A12 is not necessary, the second input pin J3 can serve as an extra pin.

Figure 7:
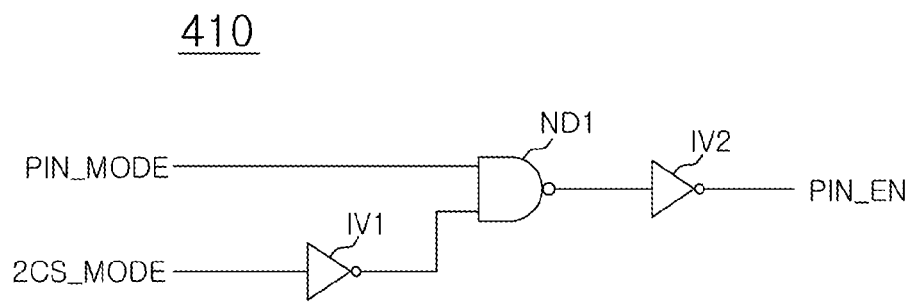
FIG. 7 is a circuit diagram illustrating the path control signal generator in FIG. 5.

FIG. 7 is a circuit diagram illustrating the path control signal generator in FIG. 5.

As illustrated in FIG. 7, the path control signal generator 410 includes first and second inverters IV1 and IV2, and an NAND gate ND1. The path control signal generator 410 generates a path control signal PIN_EN by ANDing the first mode signal PIN_MODE and an inverted second mode signal 2CS_MODE.

When only one input pin (e.g. the first input pin J2) is used according to the single control scheme, that is, when the first mode signal PIN_MODE is at a high level and the second mode signal 2CS_MODE is at a low level, the path control signal generator 410 activates the path control signal PIN_EN to a high level.

Figure 8:
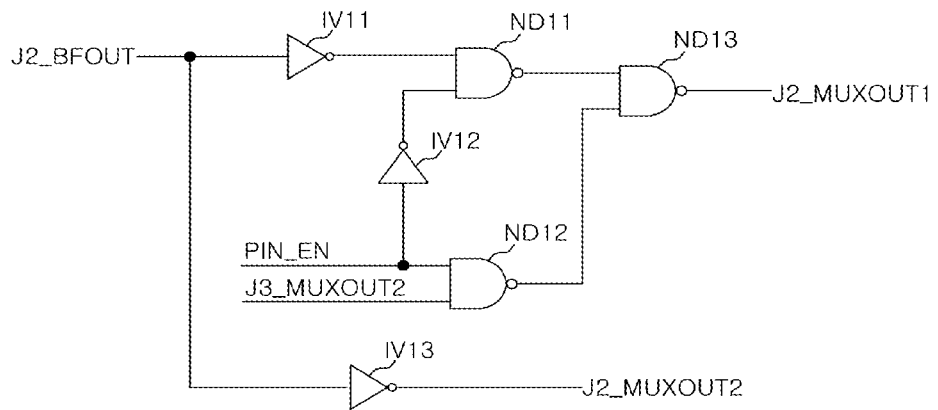
FIG. 8 is a circuit diagram illustrating the first multiplexer in FIG. 5.

FIG. 8 is a circuit diagram illustrating the first multiplexer in FIG. 5.

As illustrated in FIG. 8, the first multiplexer 420 includes first to third inverters IV11 to IV13, and first to third NAND gates ND11 to ND13. When the path control signal PIN_EN is deactivated, the first multiplexer 420 selects the output signal J2_BFOUT of the first buffer 100 to output the output signal J2_BFOUT to the first latch 500 as the first output signal J2_MUXOUT1. However, when the path control signal PIN_EN is activated, the first multiplexer 420 selects the output signal J3_MUXOUT2 of the second multiplexer 430 to output the output signal J3_MUXOUT2 to the first latch 500 as the first output signal J2_MUXOUT1. Further, the first multiplexer 420 outputs the output signal J2_BFOUT of the first buffer 100 to the second multiplexer 430 as the second output signal J3_MUXOUT2.

Figure 9:
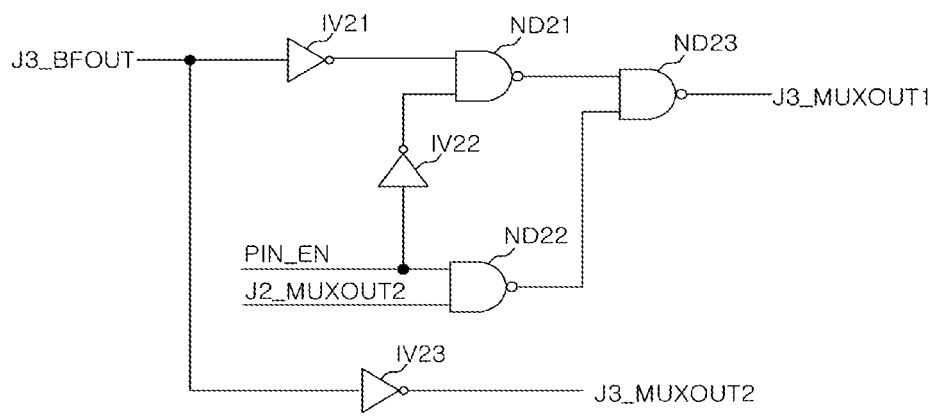
FIG. 9 is a circuit diagram illustrating the second multiplexer in FIG. 5.

FIG. 9 is a circuit diagram illustrating the second multiplexer in FIG. 5.

As illustrated in FIG. 9, the second multiplexer 430 includes first to third inverters IV21 to IV23, and first to third NAND gates ND21 to ND23. When the path control signal PIN_EN is deactivated, the second multiplexer 430 selects the output signal J3_BFOUT of the second buffer 200 to output the output signal J3_BFOUT to the second latch 600 as the first output signal J3_MUXOUT1. However, when the path control signal PIN_EN is activated, the second multiplexer 430 selects the output signal J2_MUXOUT2 of the first multiplexer 420 to output the output signal J2_MUXOUT2 to the second latch 600 as the first output signal J2_MUXOUT1. Further, the second multiplexer 430 outputs the output signal J3_BFOUT of the second buffer 200 to the first multiplexer 420 as the second output signal J3_MUXOUT2.

Hereinafter, an operation of the input circuit of the semiconductor memory apparatus according to the present invention will be described.

The input circuit according to the present invention, the chip selection signal CS1 or the address signal A12 can be input through one of the first and second input pins J2 and J3 according to selection of a user. Further, signals can be independently through the first and second input pins J2 and J3, respectively. To this end, a signal path must be set in advance such that the input circuit can properly transfer the input signal through the signal path.

The signal path can be set by allowing the first and second mode signals PIN_MODE and 2CS_MODE to have proper values using a mode register set.

As described above, the first mode signal PIN_MODE is at the low level when the first and second input pins J2 and J3 are independently used, and the first mode signal PIN_MODE is at the high level when one of the first and second input pins J2 and J3 are used, for example, when the first input pin J2 is used. The second mode signal 2CS_MODE is at the high level when the chip selection signal CS1 is input for the multi-control scheme, the second mode signal 2CS_MODE is at a high level, and the second mode signal 2CS_MODE is at the low level when the address signal A12 is input for the single control scheme.

First, in order to allow signals to be independently input to the input circuit through the first and second input pins J2 and J3, respectively, the first mode signal PIN_MODE is set to be a low level regardless of the level of the second mode signal 2CS_MODE.

The signals input through the first and second input pins J2 and J3 are transferred to the first and second buffers 100 and 200, respectively.

The first and second buffers 100 and 200 output the signals by buffering the signals, respectively.

The output signal J2_BFOUT of the first buffer 100 is output to the first multiplexer 420 and the output signal J3_BFOUT of the second buffer 200 is output to the second multiplexer 430.

Since the first mode signal PIN_MODE is at the low level, the path control signal generator 410 of FIG. 5 deactivates the path control signal PIN_EN to a low level.

Thus, the output signal J2_BFOUT of the first buffer 100 is transferred to the first signal path through the first multiplexer 420. In detail, the first multiplexer 420 selects the output signal J2_BFOUT of the first buffer 100 to output the output signal J2_BFOUT to the first latch 500.

Further, the output signal J3_BFOUT of the second buffer 200 is transferred to the second signal path through the second multiplexer 430. In detail, the second multiplexer 430 selects the output signal J3_BFOUT of the second buffer 200 to output the output signal J3_BFOUT to the second latch 600.

The first signal path includes the first input pin J2, the first buffer 100, the first multiplexer 420 and the first latch 500 and the second signal path includes the second input pin J3, the second buffer 200, the second multiplexer 430 and the second latch 600.

Next, in order to allow the chip selection signal CS1 to be input to the input circuit through the first input pin J2, the first and second mode signals PIN_MODE and 2CS_MODE are set to be a high level.

The chip selection signal CS1 input through the first input pin J2 is transferred to the first buffer 100, and no signal is input through the second input pin J3.

The first buffer 100 outputs the chip selection signal CS1 by buffering the chip selection signal CS1.

The output signal J2_BFOUT of the first buffer 100 is output to the first multiplexer 420.

Since the first and second mode signals PIN_MODE and 2CS_MODE are at the high level, the path control signal generator 410 of FIG. 5 deactivates the path control signal PIN_EN to the low level.

Thus, the output signal J2_BFOUT of the first buffer 100 is transferred to the first signal path through the first multiplexer 420. In detail, the first multiplexer 420 selects the output signal J2_BFOUT of the first buffer 100 to output the output signal J2_BFOUT to the first latch 500.

Then, in order to allow the address signal A12 to be input through the first input pin J2, the first mode signal PIN_MODE is set to be a high level and the second mode signal 2CS_MODE is set to be a low level.

The address signal A12 input through the first input pin J2 is transferred to the first buffer 100 and no signal is input through the second input pin J3.

The first buffer 100 outputs the address signal A12 by buffering the address signal A12.

The output signal J2_BFOUT of the first buffer 100 is output to the first multiplexer 420.

Since the first mode signal PIN_MODE is at the high level and the second mode signal 2CS_MODE is at the low level, the path control signal generator 410 of FIG. 5 activates the path control signal PIN_EN to the high level.

Thus, the output signal J2_BFOUT of the first buffer 100 is transferred through the second signal path.

The first multiplexer 420 selects the output signal J3_BFOUT of the second buffer 200, i.e. the second output signal J3_MUXOUT2 of the second multiplexer 430, to output the second output signal J3_MUXOUT2 to the first latch 500. Further, the second multiplexer 430 selects the output signal J2_BFOUT of the first buffer 100, i.e. the second output signal J3_MUXOUT2 of the first multiplexer 420, to output the second output signal J2_MUXOUT2 to the second latch 600.

Since no signal is input through the second input pin J3, the first output signal J3_MUXOUT1 of the first multiplexer 420 does not exert influence upon the operation of the semiconductor memory apparatus.

The chip selection signal CS1 stored in the first latch 500 is decoded by a decoder (not shown), so that the semiconductor memory apparatus can operate by recognizing that a controller connected with the semiconductor memory apparatus attempts to operate the semiconductor memory apparatus using the multi-control scheme.

The address signal A12 stored in the second latch 600 is decoded by the decoder, so that the semiconductor memory apparatus can operate by recognizing that the controller attempts to operate the semiconductor memory apparatus using the single control scheme.

The first latch 500 transfers the chip selection signal CS1 to an input terminal, which is allocated for the chip selection signal CS1, of the input terminals of the decoder. The second latch 600 transfers the address signal A12 to an input terminal, which is allocated for the address signal A12, of the input terminals of the decoder.

According to the prior art, only when the chip selection signal CS1 is input to the first input pin J2 and the address signal A12 is input to the second input pin J3, the chip selection signal CS1 and the address signal A12 can be transferred to the decoder through predetermined signal paths, respectively.

However, according to the embodiments of the present invention, although the address signal A12 is input through the first input pin J2, a signal path of the address signal A12 is switched into the original signal path, i.e. the second signal path, so that the address signal A12 can be transferred to a predetermined input terminal of the decoder. Even when the chip selection signal CS1 is input through the second input pin J3, a signal path of the chip selection signal CS1 is switched into the original signal path, i.e. the first signal path, so that the chip selection signal CS1 can be transferred to a predetermined input terminal of the decoder.

According to the input circuit of the semiconductor memory apparatus and the control method thereof of the present invention, the single control mode and the multi-control mode can be commonly used, and floating can be prevented when pins are additionally allocated. Further, even if signals different from each other are input through another input pin, the signals can be transferred through predetermined signal paths, respectively. Consequently, the utilization of the semiconductor memory apparatus can be facilitated, and interface performance of the semiconductor memory apparatus and a controller that controls the semiconductor memory apparatus can be improved.

While the present invention has been described with respect to the particular embodiments, it will be apparent to those skilled in the art that various changes and modifications may be made without departing from the spirit and scope of the invention as defined in the following claims

What is claimed is:

1. An input circuit of a semiconductor memory apparatus, the input circuit comprising:
   a first input pin;
   a first buffer including an input terminal connected with the first input pin;
   a second input pin; and
   a second buffer including an input terminal connected with the second input pin, wherein
   one of the first buffer and the second buffer is activated and the other is inactivated in response to a control mode signal for determining a control scheme of the semiconductor memory apparatus.

2. The input circuit of claim 1, wherein the first input pin receives a control signal used in a multi-control mode, and the control signal includes a chip selection signal.

3. The input circuit of claim 1, wherein the second input pin receives an address signal used in a single control mode, and the address signal is not input in a multi-control mode.

4. The input circuit of claim 1, wherein the control mode signal selects one of a multi-control mode and a single control mode.

5. The input circuit of claim 1, wherein the first buffer includes:
   a differential circuit operating based on difference between a level of reference voltage and a level of the first input pin; and
   an activating unit for determining activation of the first buffer by controlling a current path of the differential circuit according to the control mode signal.

6. The input circuit of claim 5, wherein the activating unit prevents floating of an output terminal of the differential circuit when the control mode signal is deactivated.

7. The input circuit of claim 1, wherein the second buffer includes:
   a differential circuit operating based on difference between a level of reference voltage and a level of the second input pin; and
   an activating unit for determining activation of the second buffer by controlling a current path of the differential circuit according to the control mode signal.

8. The input circuit of claim 7, wherein the activating unit prevents floating of an output terminal of the differential circuit when the control mode signal is deactivated.

9. The input circuit of claim 1, further comprising a decoder for decoding output signals of the first and second buffers to output the decoded signals.

10. The input circuit of claim 1, wherein the first buffer is configured to be inactivated by blocking its current path in response to the control mode signal.

11. The input circuit of claim 1, wherein the second buffer is configured to be inactivated by blocking its current path in response to the control mode signal.

12. An input circuit of a semiconductor memory apparatus, the input circuit comprising:
   a plurality of pins for receiving various signals including a control signal used in a multi-control mode for controlling a memory chip by dividing an entire memory area of the memory chip, and an address signal which is not used in the multi-control mode; and a plurality of buffers including input terminals connected with the pins, wherein first and second buffers of the buffers are connected with first and second pins for receiving the control signal and the address signal, and one of the first and second buffers is activated and the other is inactivated in response to a control mode signal for selecting the multi-control mode.

13. The input circuit of claim 12, wherein the first buffer includes:

a differential circuit operating based on difference between a level of reference voltage and a level of the control signal; and an activating unit for determining activation of the first buffer by controlling a current path of the differential circuit according to the control mode signal.

14. The input circuit of claim 13, wherein the activating unit prevents floating of an output terminal of the differential circuit if the control mode signal is deactivated.

15. The input circuit of claim 12, wherein the second buffer includes:

a differential circuit operating based on difference between a level of reference voltage and a level of the address signal; and an activating unit for determining activation of the second buffer by controlling a current path of the differential circuit according to the control mode signal.

16. The input circuit of claim 15, wherein the activating unit prevents floating of an output terminal of the differential circuit when the control mode signal is deactivated.

17. The input circuit of claim 12, further comprising a decoder for decoding various buffer output signals including output signals of the first and second buffers to output the decoded signals.

\* \* \* \* \*